(12) United States Patent
Roscheisen et al.

(10) Patent No.: US 7,985,919 B1
(45) Date of Patent: Jul. 26, 2011

(54) THERMAL MANAGEMENT FOR PHOTOVOLTAIC DEVICES

(75) Inventors: Martin Roscheisen, San Francisco, CA (US); Paul Adriani, Palo Alto, CA (US)

(73) Assignee: Nanosolar, Inc., San Jose, CA (US)

( * ) Notice: Subject to any disclaimer, the term of this patent is extended or adjusted under 35 U.S.C. 154(b) by 675 days.

(21) Appl. No.: 11/465,783

(22) Filed: Aug. 18, 2006

(51) Int. Cl.
*H02N 6/00* (2006.01)
*H01L 31/042* (2006.01)
*H01L 31/00* (2006.01)

(52) U.S. Cl. ........................................ 136/246; 136/259

(58) Field of Classification Search .................. 136/246, 136/259
See application file for complete search history.

(56) References Cited

U.S. PATENT DOCUMENTS

| | | | | |
|---|---|---|---|---|
| 4,106,952 A * | 8/1978 | Kravitz | | 136/206 |
| 4,361,717 A * | 11/1982 | Gilmore et al. | | 136/246 |
| 4,398,054 A * | 8/1983 | Madan | | 136/255 |
| 4,450,316 A * | 5/1984 | Hamakawa et al. | | 136/256 |
| 4,491,681 A * | 1/1985 | Kirpich | | 136/246 |
| 4,772,335 A * | 9/1988 | Huang | | 136/258 |
| 5,268,039 A * | 12/1993 | Vogeli et al. | | 136/256 |
| 5,272,375 A * | 12/1993 | Belopolsky | | 257/717 |
| 5,498,297 A * | 3/1996 | O'Neill et al. | | 136/246 |
| 5,620,904 A * | 4/1997 | Hanoka | | 438/98 |
| 6,127,622 A * | 10/2000 | Yamada et al. | | 136/251 |
| 6,774,300 B2 * | 8/2004 | McFarland | | 136/255 |
| 2003/0047208 A1 * | 3/2003 | Glenn et al. | | 136/246 |
| 2004/0261839 A1 * | 12/2004 | Gee et al. | | 136/256 |
| 2005/0072457 A1 * | 4/2005 | Glenn | | 136/246 |
| 2005/0098204 A1 * | 5/2005 | Roscheisen et al. | | 136/263 |
| 2007/0000537 A1 * | 1/2007 | Leidholm et al. | | 136/252 |

OTHER PUBLICATIONS

Glassbrenner, C., Slack, G., "Thermal Conductivity of Silicon and Germanium from 3K to the Melting Point" Physical Review, 134, 4A, 1964.*
Technical data for copper, <http://www.periodictable.com/Elements/029/data.html> accessed Feb. 12, 2010.*
Chopra et al. "Thin-Film Solar Cells: An Overview," Prog. Photovolt.: Res. Appl. 12:69-92, 2004.*

* cited by examiner

*Primary Examiner* — Jeffrey T Barton
*Assistant Examiner* — Allison Bourke

(57) ABSTRACT

Methods and devices are provided for improved thermal management for photovoltaic devices and assemblies. In one embodiment, the photovoltaic device comprises of at least one photovoltaic cell based on a thin-film photovoltaic stack deposited directly onto a thermally conductive substrate. The thermally conductive substrate is connected to a heat sink in a configuration to allow sufficient heat transfer that lowers a normal operating cell temperature (NOCT) of the photovoltaic cell, thus increasing the efficiency of the cell and the module.

28 Claims, 11 Drawing Sheets

THERMAL MANAGEMENT FOR PHOTOVOLTAIC DEVICES

FIELD OF THE INVENTION

This invention relates generally to photovoltaic devices, and more specifically, to thermal management for solar cells, solar cell strings, and/or solar cell modules.

BACKGROUND OF THE INVENTION

Solar cells and solar cell modules convert sunlight into electricity. These devices are traditionally mounted outdoors on rooftops or in wide-open spaces where they can maximize their exposure to sunlight. When sunlight intensity increases, electrical output from solar cells and solar cell modules also increases. Unfortunately, increasing sunlight intensity also typically means increased normal operating cell temperature (NOCT) of the solar cell. For solar cells and solar cell modules, excessive heat decreases the conversion efficiency of these devices. NOCT for most solar cell modules is around 47° C. Many solar cell modules lose about 0.5% efficiency for every degree of increase in NOCT. A variety of factors may contribute to increased NOCT such as greater ambient air temperature during the day, increased temperature of the solar module itself from extended sun exposure, or radiant heat from ground surfaces and other nearby surfaces which may emit heat generated from sun exposure.

A central challenge in finding suitable cooling techniques for solar cells and solar cell modules lies in finding solutions that are cost effective and easily integrated with the solar cell configuration. Although it is desirable to reduce NOCT, cumbersome or expensive cooling techniques present more cost than the conversion efficiency gained by keeping the solar cells cool. Traditional solar cell modules pose a particular challenge as the multi-layer pottants used in these modules are poor thermal conductors and do not provide an efficient thermal path for drawing thermal energy away from such solar cell modules. The challenge is even greater for modules with traditional thin-film solar cells which present heat transfer issues at the solar cell level, prior to reaching the solar module level. Traditional thin-film solar cells are typically formed on glass substrates. The thickness of glass substrates and the inherently low thermal conductivity of glass substrates complicate the cooling process as there is more mass to cool and the glass acts as a thermal barrier. Mounting thin-film glass substrate solar cells in traditional module packaging further complicates matters.

Due to the aforementioned issues, improved thermal management schemes are desired for solar cells, solar cell modules, and/or similar photovoltaic devices.

SUMMARY OF THE INVENTION

Embodiments of the present invention address at least some of the drawbacks set forth above. The present invention provides for the improved thermal management of solar cells generally, and foil-based solar cells in particular. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes. At least some of these and other objectives described herein will be met by various embodiments of the present invention.

In one embodiment of the present invention, a photovoltaic device is provided that comprises of at least one photovoltaic cell based on a thin-film photovoltaic stack deposited directly onto a thermally conductive substrate. The thermally conductive substrate may be connected to a heat sink in a configuration to allow sufficient heat transfer to lower a normal operating cell temperature (NOCT) of the photovoltaic cell, thus increasing the efficiency of the cell and the module. The thermally conductive substrate may be a metal foil, which is significantly more thermally conductive than glass substrates used in traditional thin-film photovoltaic devices.

Optionally, the following may also be adapted for use with any of the embodiments disclosed herein. The thermally conductive substrate may be comprised of a metal foil. The thermally conductive substrate may be comprised of at least one material selected from the group consisting of: stainless steel, copper, aluminum, molybdenum, or combinations thereof. The thermally conductive substrate may be comprised of a metallized plastic or polymer. The thermally conductive substrate may be comprised of a plurality of discrete layers including a back electrode and a metal foil layer. The thermally conductive substrate may be comprised of a plurality of discrete layers including a back electrode, a diffusion barrier layer, and a metal foil layer. The thermally conductive substrate may have a thermal conductivity greater than about 0.008 W/cm° C., optionally greater than about 0.100 W/cm° C., optionally greater than about 0.500 W/cm° C., or optionally greater than about 1.000 W/cm° C. A heat sink connector may be used that mechanically couples the thermally conductive substrate to the heat sink. The heat sink connector may couple the thermally conductive substrate to the heat sink via a radiation technique.

Optionally, the following may also be adapted for use with any of the embodiments disclosed herein. The thermally conductive substrate may be comprised of a substantially planar metal foil. The thermally conductive substrate may be comprised of a 3-dimensional laminar structure allowing air convection to heat away from the device. The thermally conductive substrate may be comprised of a liquid-containing vehicle that carries heat away from the device. The thermally conductive substrate comprises of at least one of the following: a heat sink with a plurality of metal fins, a heat sink with a corrugated cross-sectional shape, a heat sink with a honeycomb structure, a heat sink with a lattice structure defining a plurality of voids, or combinations thereof. The thermally conductive substrate may be comprised of a glass substrate with an interlayer in between the glass and the bottom electrode chosen such that radiative heat transfer through the glass plate lowers the NOCT. The thermally conductive substrate may be comprised of a glass substrate with a metal layer above or below the glass substrate, wherein the metal layer has a thermal conductivity sufficient so that radiative heat transfers through the glass plate and lowers the NOCT. A module support layer may be used, wherein a plurality of solar cells are mounted on to the module support layer, wherein the module support layer comprises of a highly thermally conductive material and is coupled to a heat sink to cool multiple cells.

In another embodiment of the present, a photovoltaic module is provided that includes at least one photovoltaic cell mounted on a thermally conductive module support layer. The thermally conductive module support layer comprises of a thermally conductive substrate coupled to a heat sink in a manner sufficient to allow for heat transfer from the cells to the heat sink that lowers a normal operating cell temperature (NOCT) of the photovoltaic cells, thus increasing the efficiency of the cell and the module. The photovoltaic module improves heat transfer by modifying the module backsheet so that it does not trap heat and allows heat to escape. This embodiment of the present invention is not limited to thin-film solar cells and the improved module backsheet may be adapted for use with solar cells of various types of absorber layers.

Optionally, the following may also be adapted for use with any of the embodiments disclosed herein. The photovoltaic cell may include a metal foil substrate in contact with the thermally conductive module support layer to define a thermal path for drawing heat away form the cell. The metal foil may be comprised of material selected from the group consisting of: stainless steel, copper, aluminum, molybdenum, or combinations thereof. The photovoltaic cell may include a metallized plastic or polymer in contact with the thermally conductive module support layer to define a thermal path for drawing heat away form the cell. The photovoltaic cell may be a thin-film photovoltaic cell. The photovoltaic cell may be a silicon based photovoltaic cell. The photovoltaic cell may have an absorber layer comprising of amorphous silicon. The photovoltaic cell may have an absorber layer that includes one or more inorganic materials from the group consisting of: titania (TiO2), nanocrystalline TiO2, zinc oxide (ZnO), copper oxide (CuO or Cu2O or CuxOy), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium sulfide (CdS), copper sulfide (Cu2S), cadmium telluride (CdTe), cadmium-tellurium selenide (CdTeSe), copper-indium selenide (CuInSe2), cadmium oxide (CdOx), CuI, CuSCN, a semiconductive material, or combinations of the above.

Optionally, the following may also be adapted for use with any of the embodiments disclosed herein. The photovoltaic cell may have an absorber layer that includes one or more organic materials from the group consisting of: a conjugated polymer, poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom, poly(thienylenevinylene) and derivatives thereof, and poly(isothianaphthene) and derivatives thereof, 2,2'7,7'tetrakis(N,N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, a Ruthenium-based dye, a liquid iodide/triiodide electrolyte, azo-dyes having azo chromofores (—N=N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f']diisoquinoline-1,3,8,10-tetrone and pentacene, pentacene derivatives and/or pentacene precursors, an N-type ladder polymer, poly(benzimidazobenzophenanthroline ladder) (BBL), or combinations of the above. The photovoltaic cell may have an absorber layer selected from one of the following: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, C60 and/or other small molecules, or combinations of the above. The photovoltaic cell may have an emitter wrap-through configuration.

Optionally, the following may also be adapted for use with any of the embodiments disclosed herein. The thermally conductive module support layer may be a module backsheet that includes the thermally conductive substrate and at least one thermally conductive electrically insulating layer. The thermally conductive, electrically insulating layer may be comprised of an electrical insulator with a plurality of thermally conductive particles. The thermally conductive, electrically insulating layer comprises of an electrical insulator with a plurality of metal particles dispersed and spaced apart within the electrical insulator so that there is no electrical path through the layer. The thermally conductive, electrically insulating layer may be comprised of an insulator containing a plurality of particles selected from the group consisting of: the alumina, aluminum nitride, boron nitride, zinc oxide, beryllia, silicon, diamond, isotopically pure synthetic single crystal diamond, and/or combinations thereof. A second thermally conductive electrically insulating layer may be included. A thermally conductive, electrically insulating pottant layer may be used for adhering the photovoltaic cells to the module support layer. The module support layer may be comprised of aluminum and the thermally conductive electrically insulating layer comprises of alumina. The module support layer may be comprised of aluminum anodized to have a black alumina thermally conductive electrically insulating layer. The module support layer has an underside that is black.

In another embodiment of the present invention, a photovoltaic roofing tile may be provided comprising of a metal backplane and at least one photovoltaic cell mounted on the module support layer. The backplane may be comprised of a thermally conductive substrate that is connected to a thermal sink in a manner sufficient to allow for heat transfer from the cells to the thermal sink that lowers a normal operating cell temperature (NOCT) of the photovoltaic cells, thus increasing the efficiency of the cell and the module. The backplane may be segmented to include an active conductive element for a positive charge and another active conductive element for negative charge; wherein the backplane of the tile is electrically coupled to a backplane on another tile to form a series interconnection.

In yet another embodiment, a method according to the present invention comprises of providing at least one photovoltaic cell and mounting the photovoltaic cell directly onto a thermally conductive substrate to define a thermal path from an underside of the photovoltaic cell to a thermal sink. The thermal path is preferably of sufficient capacity to lower a normal operating cell temperature (NOCT) of the photovoltaic cell, thus increasing the efficiency of the cell and the module.

Optionally, the following may also be adapted for use with any of the embodiments disclosed herein. The heat sink may be a thermally conductive foil laminated onto the thermally conductive cell base layer using a pottant material for adhesion. The pottant layer is chosen to be thermally conductive. The thermal conductivity of the pottant layer may be obtained by keeping its thickness at less than about 75 microns. The thermal conductivity of the pottant layer may be obtained by adding thermally conductive beads to thermally not very conductive adhesive. The beads added to the pottant and/or insulating layer may be ceramics. The pottant adhesive may be EVA. The back foil provides environmental protection of the module and enables heat transfer at least two orders of magnitude more easily than glass. The surface area of the module back foil may be enhanced so as to maximize heat transfer between the back foil and the surrounding atmosphere. The surrounding atmosphere may be air, a liquid, or a liquid or a gas mix with convective transport.

Optionally, the following may also be adapted for use with any of the embodiments disclosed herein. An electrically insulating layer may be used, wherein the insulating layer has an electrical withstand rating of about 1000V or better and a thermal conductivity in the range of about 0.004 to about 0.10. An electrically insulating layer may be used, wherein the insulating layer has an electrical withstand rating of about 500V or better and a thermal conductivity in the range of about 0.008 to about 0.20. An electrically insulating layer may be used, wherein the insulating layer has an electrical withstand rating of about 500V or better and a thermal conductivity in the range of about 0.008 to about 0.20, wherein the layer contains particles of thermally conductive material. An electrically insulating layer may be used, wherein the insulating layer has an electrical withstand rating of about 500V or better and a thermal conductivity in the range of about 0.008 to about 0.20, wherein the layer contains particles of thermally conductive material coated with alumina. By way of nonlimiting example, these electrically insulating layers are typically between the foil substrate the solar cells.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for an anti-reflective film, this means that the anti-reflective film feature may or may not be present, and, thus, the description includes both structures wherein a device possesses the anti-reflective film feature and structures wherein the anti-reflective film feature is not present.

Photovoltaic Device

Figure 1:
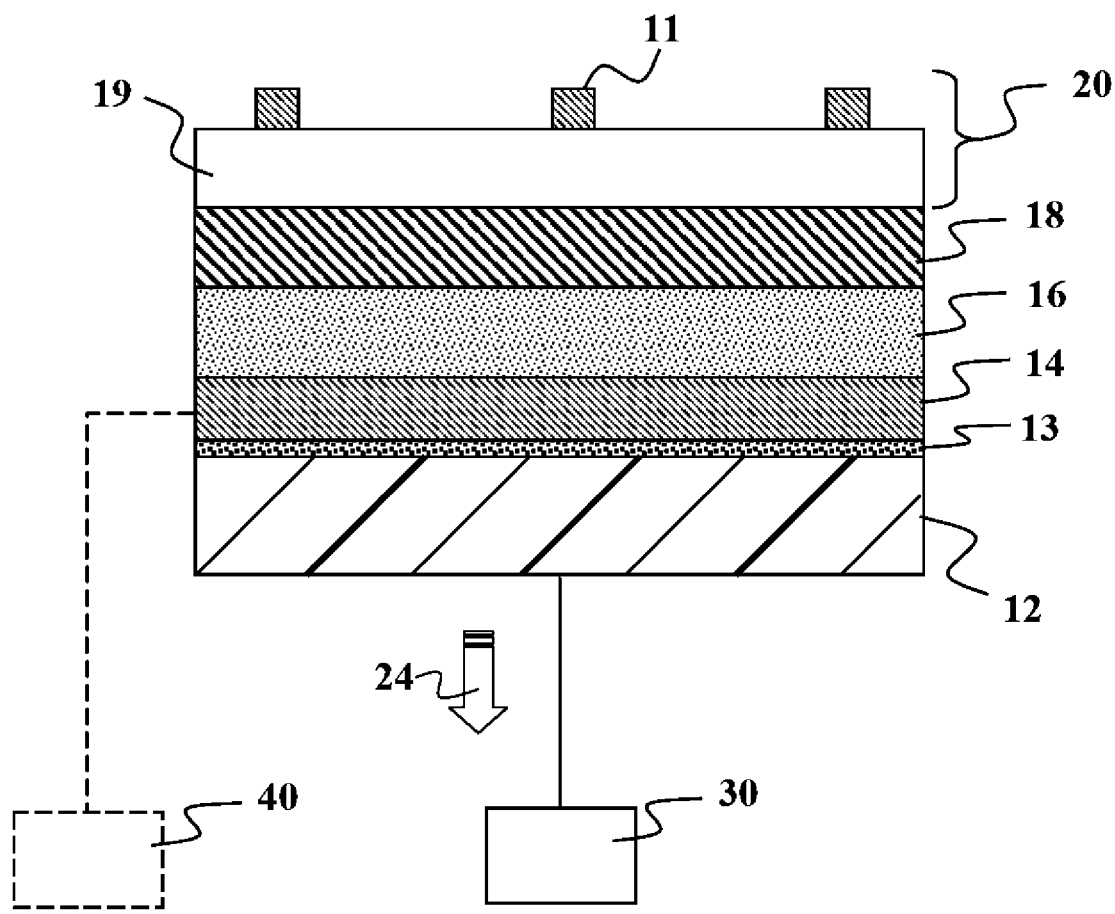
FIG. 1 is a schematic of a solar cell with a heat sink according to one embodiment of the present invention.

Referring now to FIG. 1, one example of a photovoltaic device 10 with high thermal conductivity will now be described. The device 10 includes a base substrate 12, an optional adhesion and/or diffusion barrier layer 13, a base or back electrode 14, an absorber layer 16 incorporating a film of the type described above, a semiconductor thin film 18, and a transparent electrode 20. Although not limited to the following, the absorber layer 16 may be a thin-film absorber layer. By way of nonlimiting example, the absorber layer 16 may be a material containing elements selected from groups IB, IIIA, and VIA such as $Cu(In,Ga)(S,Se)_2$, $Cu(In,Ga,Al)(S,Se,Te)_2$, and/or combinations of the above. The semiconductor thin film 18 serves as a junction partner between the compound film and the transparent conducting layer 19. If the absorber layer 16 is a p-type absorber layer, then the semiconductor thin film 18 is an n-type layer, or vice versa. By way of example, the semiconductor thin film 18 (sometimes referred to as a junction partner layer) may include inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules. The transparent conductive layer 19 may be inorganic, e.g., a transparent conductive oxide (TCO) such as but not limited to indium tin oxide (ITO), fluorinated indium tin oxide, zinc oxide (ZnO) or aluminum doped zinc oxide, carbon nanotubes, or a related material. Optionally, a layer of material such as i-ZnO may be used between layers 18 and 19 and this may be applied to any of the embodiments described herein. The transparent electrode 20 may include a transparent conductive layer 19 and a layer of metal (e.g., Al, Ag, Cu, or Ni) fingers 11 to reduce sheet resistance.

Referring still to FIG. 1, the present invention provides improved thermal conductivity by using a highly thermally conductive substrate 12. The substrate 12 preferably has a thermal conductivity higher than those of traditional substrate materials to allow for sufficient heat transfer to lower the NOCT. This is particularly true for the present invention relative to traditional solar cells formed on glass, which is a very low thermal conductivity material. FIG. 1 shows that the highly thermally conductive substrate 12 provides a thermal pathway for heat to escape from the solar cell as indicated by arrow 24. As schematically shown, the substrate 12 is selected so that heat may pass through it to one or more heat sinks 30, or optionally, the heat may simply be dissipated along the underside surface of the solar cell and carried away by air convection. The heat sink 30 itself may have an air-cooled surface, water-cooled surface, or other surface that draws away and dissipates heat from the cell, decreasing the cell NOCT. It should be understood that the heat sink 30 is shown generically in FIG. 1 since a variety of different types of heat sinks may be adapted for use with the present invention and no particular design is excluded. Optionally, edge coupling may also be used to draw heat away from thermally conductive layers in the solar cell 10 to one or more heat sinks 40 (shown in phantom).

It should be understood that the use of metallic materials for the high thermally conductive base substrate 12 may advantageously improve the rate of solar cell cooling. By way of nonlimiting example, the highly thermally conductive base substrate 12 may be a foil including a metal such as, but not limited to, aluminum, copper, molybdenum, stainless steel, titanium, other metal foils, or combinations thereof. The thermal conductivity (W/cm° C.) of metallic foil substrates such as aluminum (2.165) or copper (3.937) is significantly higher than those of traditional solar cell substrates such as silicon (1.457) and many orders of magnitude better than those solar cells based on glass (0.008). The metal foils will improve heat transfer out from the cell 10 and improve NOCT. In other embodiments of the present invention, the base substrate 12 may optionally be a hybrid material selected from one of the following: metallized ceramic plates, metallized plastic, metallized polymer plates, metallized glass plates, and/or any single or multiple combinations of the aforementioned. In one embodiment, the thermally conductive substrate 12 is in direct contact with the absorber layer and can efficiently draw heat away from the cell without substantially altering the cell structure or adding significant cost.

Optionally, the base electrode 14 may be made of a thermally conductive metallic material to minimize any thermal barriers that may impede a heat transfer path out of the solar cell. By way of nonlimiting example, the base electrode 14 may be of a metal layer whose thickness may be selected from the range of about 0.1 micron to about 25 microns. The base electrode 14 may be made of aluminum, copper, stainless steel, titanium, molybdenum, other suitable metal foils, or combinations thereof. As seen in FIG. 1, the base electrode 14 may optionally be edge coupled to a heat sink 40.

Optionally, a thermally conductive intermediate layer 13 may be incorporated between the electrode 14 and the substrate 12. If there is an intermediate layer 13, the layer 13 is preferably a thermally conductive, diffusion barrier layer that does not impede a heat transfer path out of the solar cell, while preventing diffusion of material between the substrate 12 and the electrode 14. The diffusion barrier layer 13 may be electrically conductive or electrically nonconductive. As nonlimiting examples, the layer 13 may be composed of any of a variety of materials, including but not limited to chromium, vanadium, tungsten, or compounds such as nitrides (including tantalum nitride, tungsten nitride, titanium nitride, silicon nitride, zirconium nitride, and/or hafnium nitride), oxides, carbides, and/or any single or multiple combination of the foregoing. Optionally, a diffusion layer 15 (shown in phantom) may be on the underside of substrate 12 and be comprised of a material such as but not limited to chromium, vanadium, tungsten, or compounds such as nitrides (including tantalum nitride, tungsten nitride, titanium nitride, silicon nitride, zirconium nitride, and/or hafnium nitride), oxides, carbides, and/or any single or multiple combination of the foregoing. This layer 15 may be adapted for use with any of the embodiments described herein.

Figure 2A:
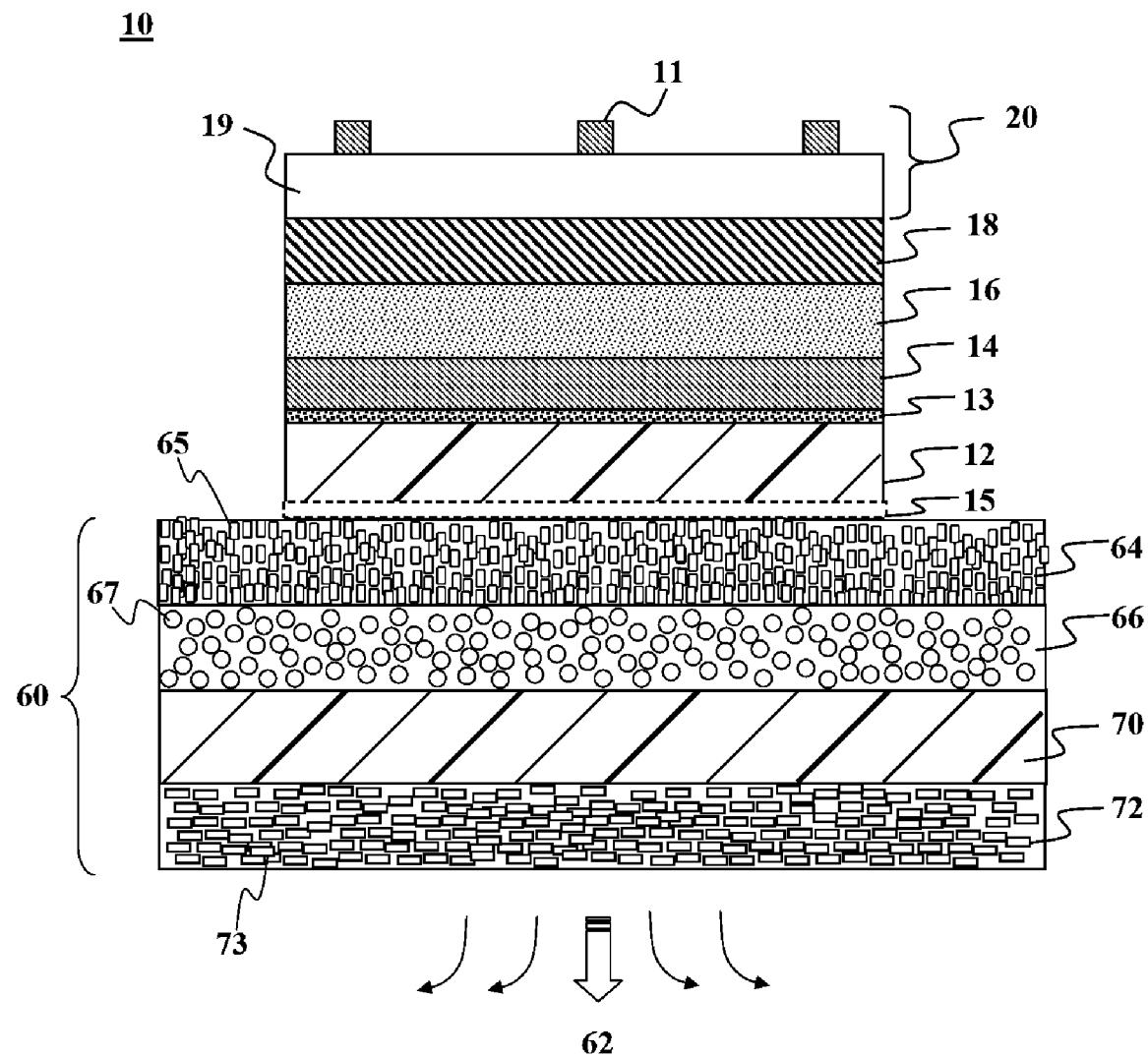
FIGS. 2A-2C shows various embodiments of a solar cell mounted over backsheets according to embodiments of the present invention.

Referring now to FIG. 2A, another embodiment of the present invention will now be described in further detail. FIG. 2A shows one technique for incorporating a highly thermally conductive solar cell 10 as part of a solar module having a plurality of solar cells 10. For ease of illustration, the upper layer(s) of the module are not shown. The module may have a backsheet 60 on which the plurality of solar cells 10 are mounted. To maximize the benefits of a highly thermally conductive solar cell, the module should use a highly thermally conductive backsheet 60 to provide a thermal conduction path for heat to escape from the solar cell 10, as indicated by arrows 62. Without a thermally conductive backsheet 60, heat from the solar cell 10 would be trapped by conventional backsheet material which is thermally insulating.

As seen in FIG. 2A, the present embodiment of the thermally conductive backsheet 60 may be comprised of a plurality of discrete layers. The layer 64 may be a thermally conductive encapsulant layer. The layer 66 may be a thermally conductive, electrically insulating layer. The layer 70 may be a thermally conductive substrate layer that provides structural support. The layer 72 may be a thermally conductive, weather resistant layer that protects the other interior layers. As seen in FIG. 2A, the layers 64, 66, and 72 may contain particles dispersed in the layers to improve thermal conductivity. These particles may be of various shapes and/or sizes. The particle shapes may be spherical, rod-like, polygonal, or combinations thereof. Particles may also be made from only one material. Optionally, some particles may be of one material while others are of one or more other materials. The particles are preferably of a material that is electrically insulating and highly thermally conductive. Optionally, the particles may be formed from an electrically conductive and thermally conductive material. If the material is both thermally and electrically conductive, the particles are preferably held in a material that is electrically insulating. In this manner, the electrical insulating properties are maintained while the thermal conductivity properties are improved. By way of nonlimiting example, the particles may be made of one or more of the following materials: alumina, aluminum nitride, boron nitride, zinc oxide, beryllia, silicon, diamond, isotopically pure synthetic single crystal diamond, and/or combinations thereof. A commercially available form of aluminum nitride sold under the trade name Hi-Therm™ Aluminum Nitride is also suitable for use with the present invention. Other embodiments of the present invention may use micronized silver with dispersing agents on the particles to disperse them in the material. Some of the particles may be coated with alumina (such as by anodization or ALD) to facilitate dispersion in the layer. The resulting layer such as but not limited to layer 66 may have a thermal conductivity in the range of about 0.002 to about 0.1, optionally 0.004 to about 0.04, or optionally about 0.004 to about 0.02 (W/cm° C.).

Referring still to FIG. 2A, the layer 64 serves as a pottant layer on the backsheet 60. Layer 64 may be comprised of one or more of the following materials (mixed with the particles 65): ethyl vinyl acetate (EVA), polyvinyl butyral (PVB), ionomer, silicone, thermoplastic polyurethane (TPU), thermoplastic elastomer polyolefin (TPO), tetrafluoroethylene hexafluoropropylene vinylidene (THV), fluorinated ethylene-propylene (FEP), saturated rubber, butyl rubber, thermoplastic elastomer (TPE), flexibilized epoxy, epoxy, amorphous polyethylene terephthalate (PET), urethane acrylic, acrylic, other fluoroelastomers, or combinations thereof. The layer 66 serves as an electrically insulating layer on the backsheet 60. Layer 66 may be comprised of one or more of the following (mixed with the particles 67): PET, polyethylene naphthalate (PEN), polyvinylfluoride (PVF), ethylene tetrafluoroethylene (ETFE), Poly(vinylidene fluoride) (PVDF), polychlorotrifluoroethylene (PCTFE), FEP, THV, fluoroelasomer, fluoropolymer, polyamide, polyimide, polyester, or combinations thereof. The layer 70 serves as a structure layer on the backsheet 60 and layer 70 may be comprised of aluminum, stainless steel, tinned copper, copper, chromed steel, galvanized steel, galvalume steel, nickel plated steel, tin, titanium, or molybdenum. The layer 72 serves as a protective layer on the backsheet 60. It may be comprised of one or more of the following (mixed with the particles 73): PET, PEN, PVF, ETFE, PVDF, PCTFE, FEP, THV, fluoroelastomer, fluoropolymer, polyamide, polyimide, polyester, or combinations thereof. Preferably, the layer 72 is of a dark or black color as these colors have a greater emissivity than highly reflective or mirrored surfaces. As a nonlimiting example, black surfaces may have an emissivity in the range of about 0.80 to about 0.85. A highly reflective mirrored surface may have an emissivity in the range of about 0.02 to 0.03 and this is less desirable.

Figure 2B:
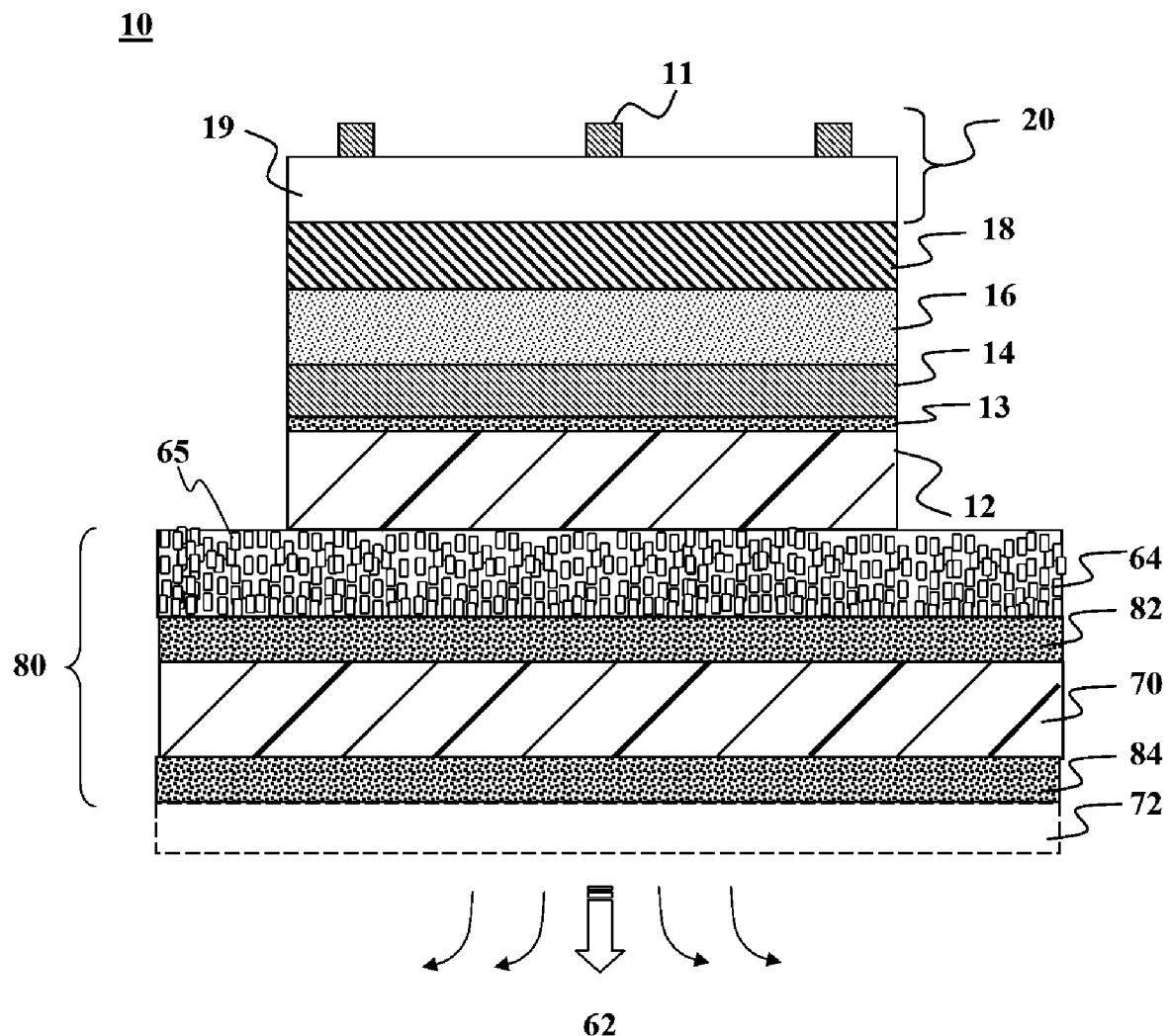

Referring now to FIG. 2B a variation on the embodiment shown in FIG. 2A will now be described. FIG. 2B shows a solar cell 10 mounted over a modified thermally conductive module backsheet 80. In the present embodiment, the backsheet 80 is a simplified configuration to facilitate manufacturing. The backsheet 80 continues to have the encapsulant layer 64 with particles 65. The layer 70, however, is modified to have an alumina layer 82 above and/or an alumina layer 84 below the layer 70. The alumina layers 82 and 84 may be a more economical option since alumina may be formed directly on the layer 70 in a fairly straight forward process such as but not limited to anodization. Because both layers can be formed in the same process, this may reduce cost and the number of manufacturing steps. The aluminum layer 70 with the alumina layers 82 and 84 may then be integrated with the layer 64 to form the backsheet 80. Advantageously, the alumina layers 82 and 84 formed via anodization may be black in color to improve the emissivity of the layer 84 in dispersing thermal energy from the solar cell. Optionally, only one side of the aluminum layer 70 has an alumina layer. The side not covered with alumina may have a layer 66 or 72 as found in FIG. 2A. Optionally, for embodiments that desire very high electrical insulation or protection, one or both layers 66 or 72 may be used in combination with layers 82 and 84.

Figure 2C:
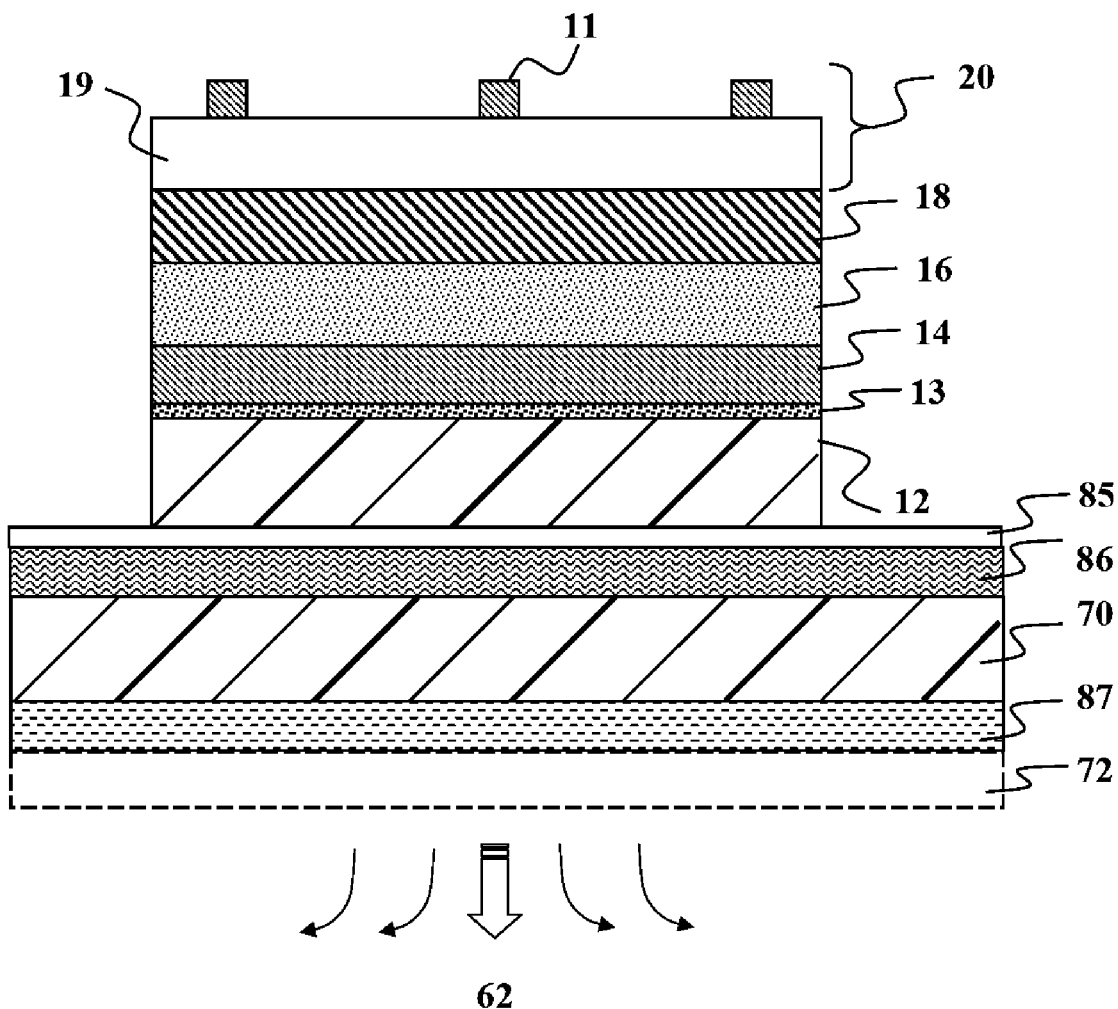

Referring now to FIG. 2C, a still further embodiment of the configuration of FIG. 2A will now be described. FIG. 2C shows a thermally conductive, electrically insulating layer based on using reduced thickness of insulating and/or adhesive layers. As a nonlimiting example, layer 85 can be EVA or butyl tape chosen to be very thin such as about 2 mils (50 microns) because then it is still thermally conductive. This embodiment may use very thin EVA pottant plus a thin backfoil 70 to provide the desired properties. Conventional silicon based modules typically use an EVA layer with a thickness of about 18 mil (450 microns) for deep cushioning of brittle silicon, for filling gaps between cells, and for the steps up and down around the busbars on top of the silicon cells. At a thickness of 18 mil, a layer using conventional materials is not sufficiently thermally conductive.

In the embodiment shown in FIG. 2C, the present invention moves away from the conventional EVA material and process. By way of nonlimiting example, the layer 85 may be an EVA layer having a minimum thickness of about 0.5 mil (about 10 micron) and can provide substantially uniform wetting and adhesion on the upper and lower interfaces of the adhesive. Optionally, a thickness of about 1 to about 2 mil (25 to 50 microns) is better/best for the wetting and adhesion. Optionally, about 2 mil may be a better balance point of low materials cost, good adhesive wetting, a moderate to good level of electrical insulation and voltage withstand, and a moderate to good level of thermal conductivity. Optionally, the thickness may be about 0.1 mil to about 10 mil. Other materials suitable for use in layer 85 include but are not limited to PVB, ionomer, silicone, TPU, TPO, THV, FEP, saturated rubber, butyl rubber, TPE, flexibilized epoxy, epoxy, amorphous PET, urethane acrylic, acrylic, other fluoroelastomers, or combinations thereof.

Referring still to FIG. 2C, layer 86 may be comprised of an insulating material such as but not limited to PET. The thickness of the layer 86 depends on the electrical withstand rating that is desired. If the layer 86 is designed to withstand 1000 volts, the thickness may be in the range of about 5 mil (125 microns). Although not limited to the following, if layer 86 is thicker than about 2 mil (50 microns, 400 volts electrical withstand), then the layer 86 may contain particles as described for FIG. 2A to increase thermal conductivity. Layer 87 may be comprised of a material such as but not limited to Tedlar®, alumina, or similar material. The thickness may be in the range of about 0.5 mil to about 4.0 mil. Optionally, the thickness may be about 0.1 mil to about 10 mil. If the thickness exceeds about 2 mil, the layer 87 may also include particles as described in FIG. 2A to improve thermal conductivity.

To achieve the desired thickness of the layers in FIG. 2C, various techniques may be used. Conventionally, EVA is available in a thickness range of 9 mil to 18 mil (220 microns to about 450 microns). Thinner layers of this thermoset material are generally not available because of technical limitations of the material formulation when used in commercial manufacturing process. To achieve thicknesses of about 9 mil or less for the present invention, spray coating and/or slot die coating of EVA or the like may be used. Other techniques may involve using gravure and microgravure coating. The EVA may be dispersed in a carrier liquid that allows for solution deposition. In one embodiment, the EVA is dispersed in water and then applied by spraying and/or slot die coating, followed by evaporation of the water to achieve the desired 0.5 to about 2 mil thickness. Of course, thinner layers may also be achieved using the above technique or other techniques. Other non-vacuum techniques may also be used such as but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray deposition, and the like, as well as combinations of the above and/or related technologies.

It should be understood that at a thickness of about 2 mil and below, the challenge of filling gaps between cells may be addressed with an additional manufacturing processing step to add EVA or other similar material in the gaps and/or steps as a "planarizing" process. The planarizing may involve ink jetting, needle dispensing, microspraying, doctor blading, or screen printing material to fill gaps prior to applying the thin layer of EVA. This eliminates steps, gaps, or other surface anomalies that may be found. The filling of these gaps in a planarizing step does not significantly impact the thermal conductivity since these gaps are a very small portion of the surface area used for heat transfer. A separate planarizing step is not needed in the 9 mil to 18 mil range. In the range of 2 mil to 9 mil, the need depends on the details of the cells and the details of the cell string configuration.

Figure 3:
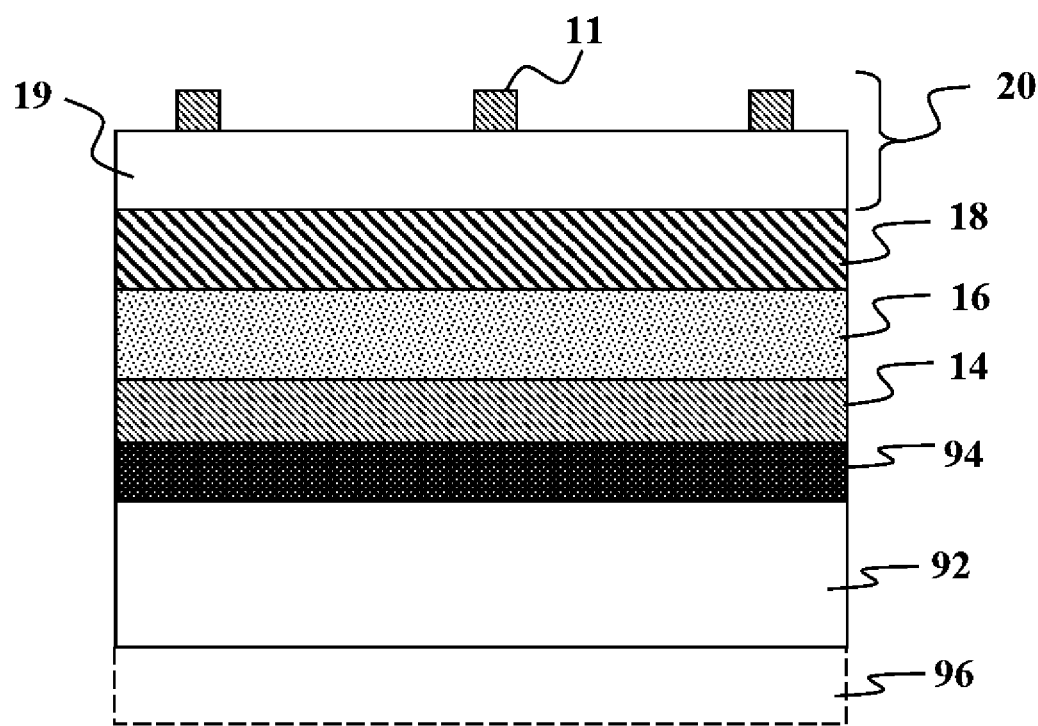
FIG. 3 shows a cross-sectional view of another solar cell according to an embodiment of the present invention.

Referring now to FIG. 3, it should be understood that improvements can also be made to traditional glass based solar cells to improve heat transfer. FIG. 3 shows a traditional glass-based thin-film cell 90 with a glass substrate 92 modified with an interlayer 94 between the glass substrate and the bottom electrode such that radiative heat transfers through the glass substrate and lowers the NOCT. The interlayer 94 may be comprised of one or more of the following: metal oxide, metal nitride, such as alumina, aluminum nitride, boron nitride, zinc oxide, beryllia or highly temperature stable polymer such as polyimide, or combinations thereof. The interlayer 94 may have a thickness in the range of about 0.5 micron to 50 microns. Optionally, a bottom layer 96 may be added facilitate the heat transfer from interlayer 94 through the glass substrate 92. The bottom layer 96 may be made of material similar to that used for the interlayer 94.

High Efficiency Cell Configuration

Figure 4:
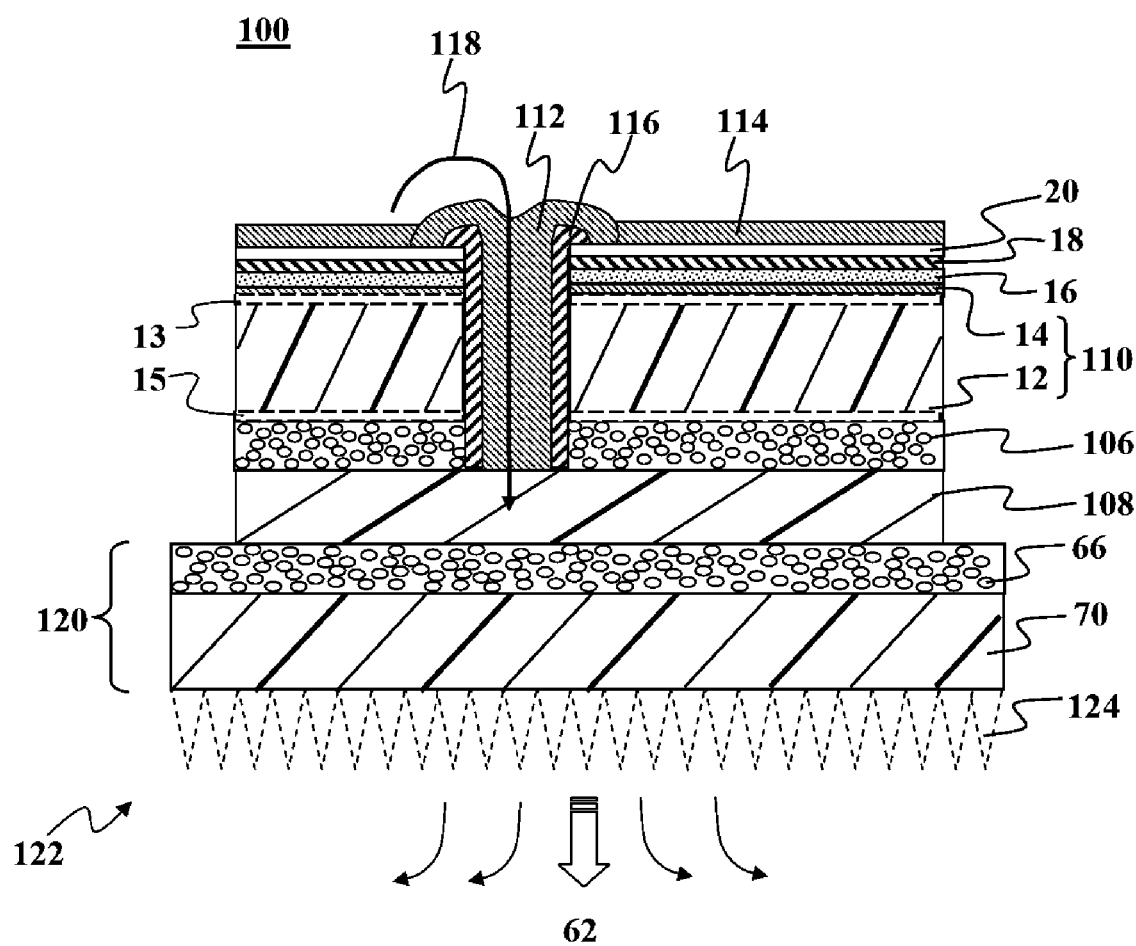
FIGS. 4 and 5 show embodiments of high efficiency solar cells mounted over backsheets according to embodiments of the present invention.

Referring now to FIG. 4, it should be understood that the thermal management schemes described above may be adapted for use in a high efficiency cell configuration as detailed below. FIG. 4 illustrates a solar cell 100 attached to an electrically insulating carrier substrate 66, which may be made of a plastic material such as polyethylene terephthalate (PET), e.g., about 50 microns thick. The carrier substrate 66 may, in turn, be attached to a thicker structural membrane 70 to facilitate mounting of the module.

By way of nonlimiting example, the solar cell 100 may use a high efficiency emitter wrap-through (EWT) configuration. The high efficiency solar cell 100 includes the p-type absorber layer 16 and other layers as set forth above in FIG. 1. In addition to those layers, the solar cell 100 also includes an electrically insulating layer 106 and a conductive back plane 108. The use of back plane 108 can be very advantageous as will be described below. The electrically insulating layer 106 may be located between the bottom electrode 110 and the conductive back plan 108. Optionally, the layer 106 includes particles similar to those found in layer 66 which improves heat transfer through the layer without substantially increasing electrical conductivity. In one embodiment, the base substrate 12 includes a first metal foil and the conductive back plane 108 includes a second metal foil.

It should be understood that in some embodiments of the present invention, the back plane 108 may be described as a backside top electrode 108. This is because a via filled with electrically conductive material 112 electrically couples the transparent conductive electrode 20 and fingers 114 on the front side of the solar cell with the back plane 10, wherein insulating layers 116 insulate the sidewalls of the via. The electrical conduction path is indicated by arrow 118. This allows for narrower fingers on a topside surface since electrical current is carried along the backside and the fingers are only needed to gather the electrical current from the topside. Narrower fingers and/or fewer fingers means that more surface area of the solar cell can receive sunlight, and this increase in surface area exposure also increases electrical output. Additionally, the electrical conduction path 118 is also representative of thermal conduction path through the material 112 to draw heat away from the absorber layer of the cell 100.

In the present embodiment, at least the base substrate 12 is made of a metal foil, such as but not limited to aluminum foil. Alternatively, copper, stainless steel, titanium, molybdenum, other suitable metal foils, or combinations thereof may be used. The back plane 108 may be made of similar metal material. Hybrid materials previously discussed may also be used. The use of these electrically conductive materials creates highly thermally conductive pathways through which heat may be extracted away from the device layers 102 in contact with a bottom electrode 104.

Referring still to FIG. 4, in addition to using thermally efficient solar cells, improvements may also be made at the module level. One technique involves improving the thermal conductivity of the module backsheet. FIG. 4 shows that a highly thermally conductive backsheet 120 may be used, comprising of an electrically insulating, thermally conductive layer 66 and a thermally conductive support layer 70. These layers may be similar to those described in FIG. 2. Optionally, the present invention may also include a heat sink 122 with fins 124 (shown in phantom) attached to the underside surface of the backsheet 120. The fins 124 create greater surface area for heat to be carried away from the heat sink 122 by way of air convection. The fins 124 define a 3-dimensional laminar structure where air convection carries heat away from via a thermal path as indicated by arrow 62. The air convection may be via forced air (e.g. fan, blower, etc. . . . ) or by natural convection.

Figure 5:
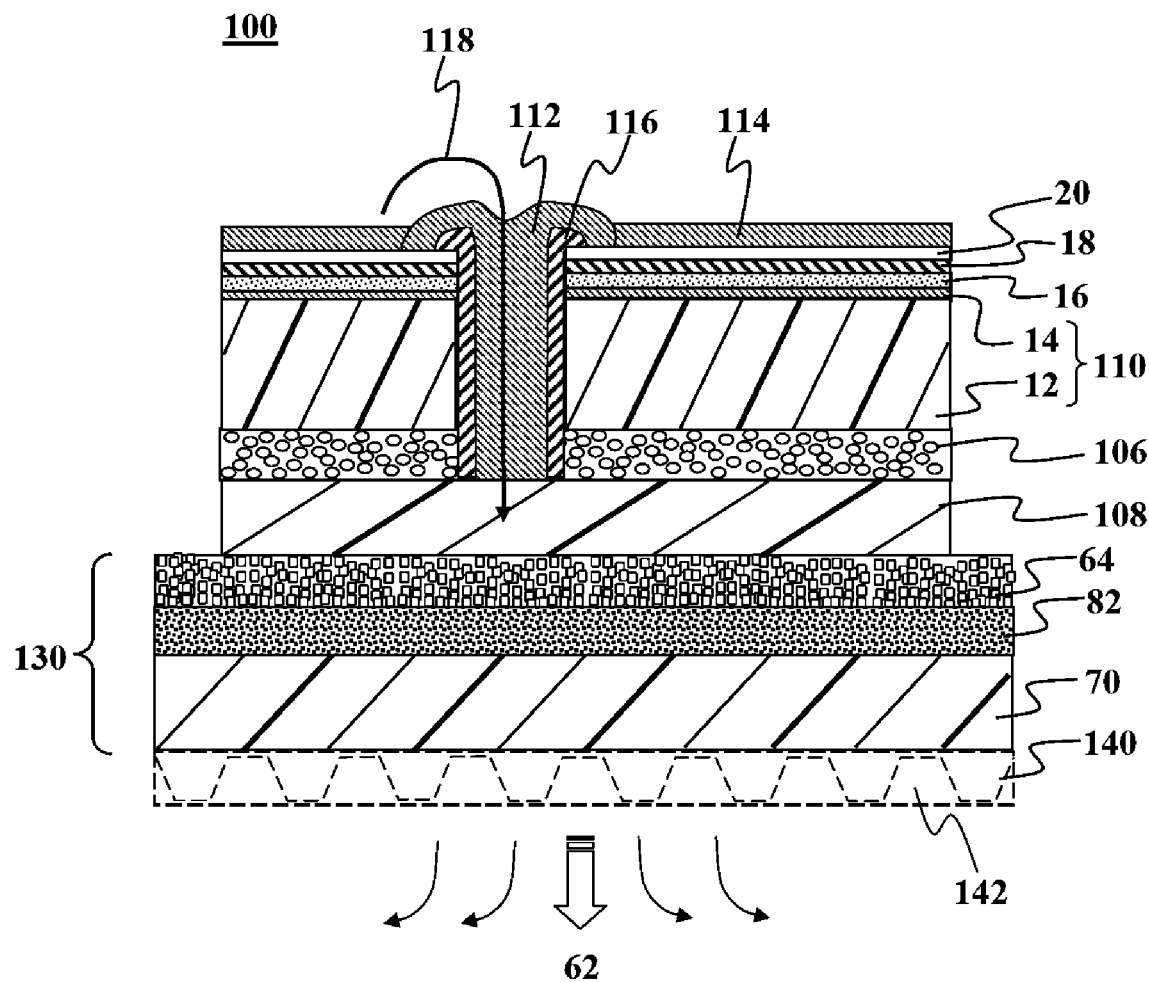

Referring now to FIG. 5, a variation on the embodiment shown in FIG. 4 will now be described. FIG. 5 shows a solar cell 100 mounted over a modified thermally conductive backsheet 130. The backsheet 130 may include a thermally conductive pottant layer 64, an electrically insulating alumina layer 82, and a structural layer 70. This combination of layers provides the desired electrical insulation without blocking the thermal heat transfer path out of the solar cell 100. By way of nonlimiting example, the thickness of layer 64 may be in the range of about 10 to about 1000 microns, layer 70 may be in the range of about 10 to about 10000 microns, and layer 82 may be in the range of about 0.1 to about 100 microns. The backsheet 130 may also include a heat sink 140 having a corrugated design wherein air may flow between portions of the sink to carry heat away. Optionally, piping for liquid flow may be inserted into the various openings 142 to increase the rate of cooling. Optionally, liquid flow may be induced directly within the corrugations.

Figure 6:
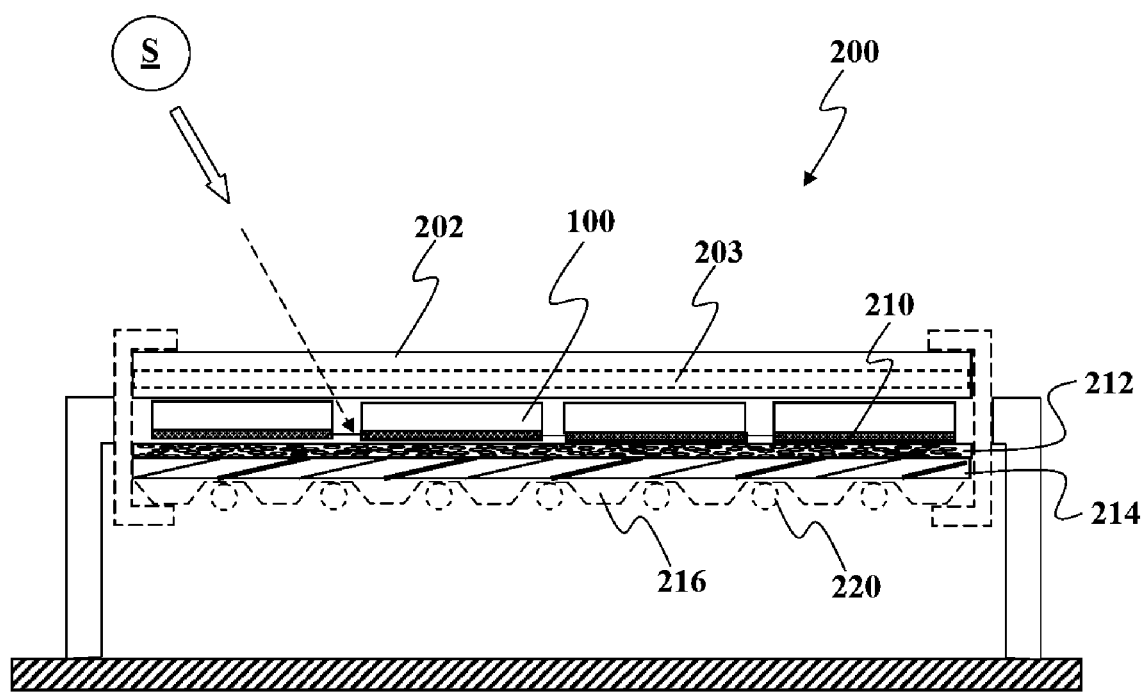
FIG. 6 is a cross-sectional view of a module according to an embodiment of the present invention.

Referring now to FIG. 6, a cross-sectional view of a thermally conductive module 200 having a plurality of solar cells 100 is shown. The cells 100 may be serially interconnected in a manner as discussed in commonly assigned copending U.S. patent application Ser. No. 11/039,053 filed Jan. 20, 2005, fully incorporated herein by reference for all purposes. Sunlight coming from the sun S will heat the cells 100 and the surrounding module components. The outer barrier layer 202 may be a rigid glass layer or it may be a flexible barrier as described in commonly assigned copending U.S. Provisional Patent Application Ser. No. 60/806,096 filed Jun. 28, 2006, fully incorporated herein by reference for all purposes. Optionally, the layer 202 may have channels or openings 203 wherein liquid and/or air may flow to cool the module from a top side. The module 200 may have cells 100 each with a metal foil underside 210 mounted on a thermally conductive, electrically insulating layer 212 that is coupled to a metal foil structural layer 214. The present embodiment may also include a heat sink 216 (shown in phantom) which has a corrugated configuration for radiating heat away from the solar cell module 200. The heat sink 216 may be positioned sufficiently far off of the ground to allow for air convection. Optionally, liquid cooling techniques may also be used by arranging a plurality of pipes 220 (shown in phantom) in contact with the module 200 to provide fluid flow that carries heat away form the module 200. Such a liquid cooling system may be water-based, freon-based, or other fluid-based cooling assemblies as known in the art.

Figure 7:
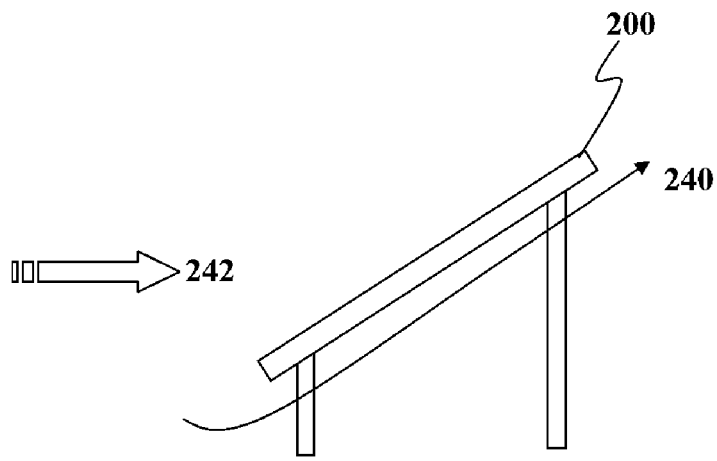
FIG. 7 shows a module mounted on a support according to an embodiment of the present invention.

FIG. 7 shows that the module 200 may also be mounted at an angle so that as heat rises, convection and rising hot air will cause air flow as indicated by arrow 240. This will facilitate the removal of heat from the cell, providing a pathway for rising hot air to escape from the underside of the solar module 200. The angled configuration also present a larger area that may be exposed to any horizontal cross winds 242 that will also help cool the module 200. Of course, this embodiment may also be modified to include liquid cooling devices as shown in FIG. 6.

Structural Backside Layer

Figure 8A:
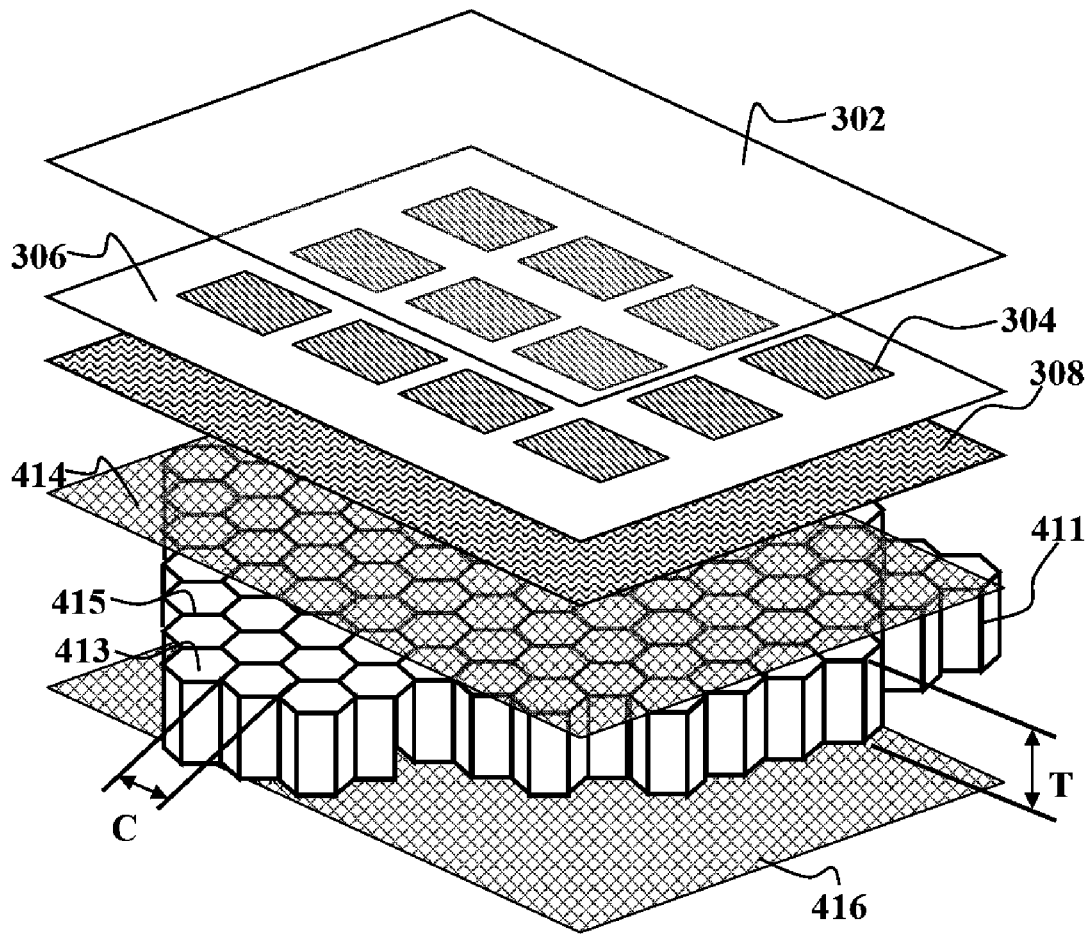
FIGS. 8A and 8B show perspective views of modules with rigid backsheets according to embodiments of the present invention.
Figure 8B:
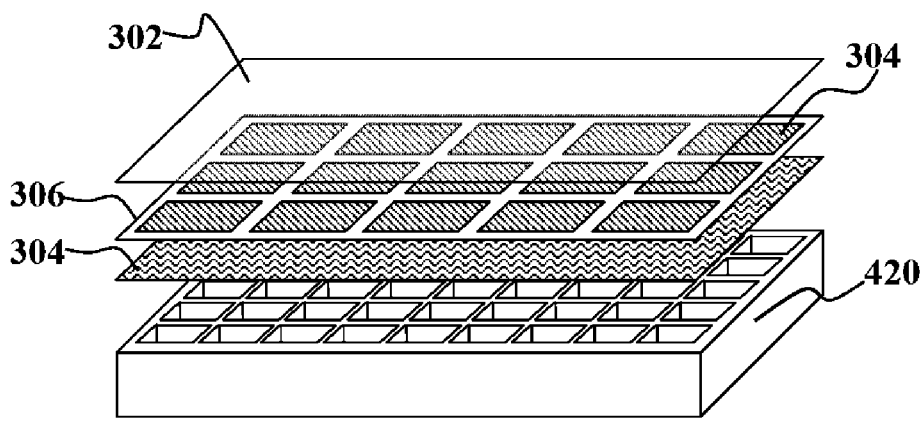

FIGS. 8A and 8B show that the different types of structural backside layers, in addition to those previously described, may be adapted for use with a solar cell module 300. FIG. 8A depicts the solar cell module 300 with a flexible top sheet 302 (e.g., ETFE, which is sold by DuPont under the name Tefzel®), a plurality of solar cells 304 embedded in a pottant 306 such as EVA, and a flexible back sheet 308 (e.g., a PVF-polyester-PVF laminate). Of course, the pottant 306 and/or back sheet 308 may optionally include particles similar to those described in FIG. 2 for improving thermal conductivity without substantially altering the electrical properties of the layers. The PV cells 304 are arranged in a substantially planar fashion. Each solar cell has a front side 303 and a back side 305. One or more photovoltaic cells are adapted to produce an electric voltage when light is incident upon the front side 303. A back plane 310 is attached to the one or more of the solar cells 304 such that the back plane provides structural support from the back side 305. In certain embodiments of the present invention, it is desirable for the back plane 310 the back plane to be made in a rigid form. This avoids the use of a frame that would otherwise cover space for the PV cells 304.

In a preferred embodiment, solar cell module 400 includes a rigid back plane 410 having a structural component in the form of a honeycomb material 411 as depicted in FIG. 8A. Voids in the form of hexagonal honeycomb channels 413 communicate across the thickness of the honeycomb material 411. By way of nonlimiting example, the honeycomb material 411 may be of any suitable material, e.g., metallized plastics, metal, steel, stainless steel, copper, aluminum, carbon fibers, Kevlar®, and other materials with similar elasticity or compressibility properties in the range of the foregoing materials. The voids 413 allow the back plane 410 to be relatively light in weight while maintaining strength. The voids 413 can also provide pathways for thermal conduction and/or convention. The back plane 410 may further include front and back planar elements 312, 314 on either side of the structural component 311. The planar elements 312, 314 may provide thermal contact, electrical insulation, or structural rigidity to the structural component. Lateral air flow passages in the lattice-like material can aid in air cooling, mitigating module heating.

Honeycomb materials may be flexible and easily bent out of a substantially planar shape. To provide rigidity to the back plane 410, the honeycomb material 410 may be rigidized with a planar element in the form of a skin 414 attached to a support surface 415 of the honeycomb material such that the skin 414 rigidizes the honeycomb material 411. In some embodiments the honeycomb material 411 may be sandwiched between two sheets of skin material 414, 416. Material with a honeycomb core sandwiched between two layers of skin is commercially available from NidaCore. The skin 414, 416 may be made of any suitable lightweight material, e.g., a woven scrim, a textile, plastic sheet or sheet metal, or combinations of these materials. In some embodiments, the bottom skin 416 is removed so that there is greater access through the honeycomb for air flow to reach the underside of the solar cells. In other embodiments, skin 414 is not used. Both are preferably thermally conductive so as to facilitate heat transfer out of the solar module.

In some embodiments, the honeycomb material 411 and skin 414, 416 may be made of thermally conductive or electrically conductive materials, e.g., metals such as aluminum or copper. The use of such thermally conductive materials allows for efficient transfer of heat from the solar cells 304. In some embodiments, the skin 416, 418 may be an electrically conductive material having an insulating coating between the electrically conductive material and the solar cells 304. Further details on a honeycomb material can be found in commonly assigned copending U.S. patent application Ser. No. 11/243,522, filed Oct. 3, 2005 and fully incorporated herein by reference for all purposes.

Referring now to FIG. 8B, in an alternative embodiment of the present invention, the structural material may be a rectangular grate 420 which provide structural support. The grate 420 may be made of any suitable material, e.g., metallized plastics, metal, steel, stainless steel, copper, aluminum, carbon fibers, Kevlar®, and other materials with similar elasticity or compressibility properties in the range of the foregoing materials. The grate 420 continues to exhibit the voids which create a light yet strong structural element. The voids may also allow for improved air flow to facilitate cooling.

The embodiments of FIGS. 8A and/or 8B may also use multi-layer top sheet in place of the top sheet 302. A suitable multi-laminate top sheet is described in commonly assigned, copending U.S. Patent Application Ser. No. 60/806,096 filed Jun. 28, 2006 and fully incorporated herein by reference for all purposes. Of course, some embodiments may also use a rigid top sheet such as glass. However, the flexible top sheets are typically thinner than glass and can transfer more heat, allowing heat to escape from both the front and/or the back of the module.

Advantages of a Metallic Back Layer

Figure 9:
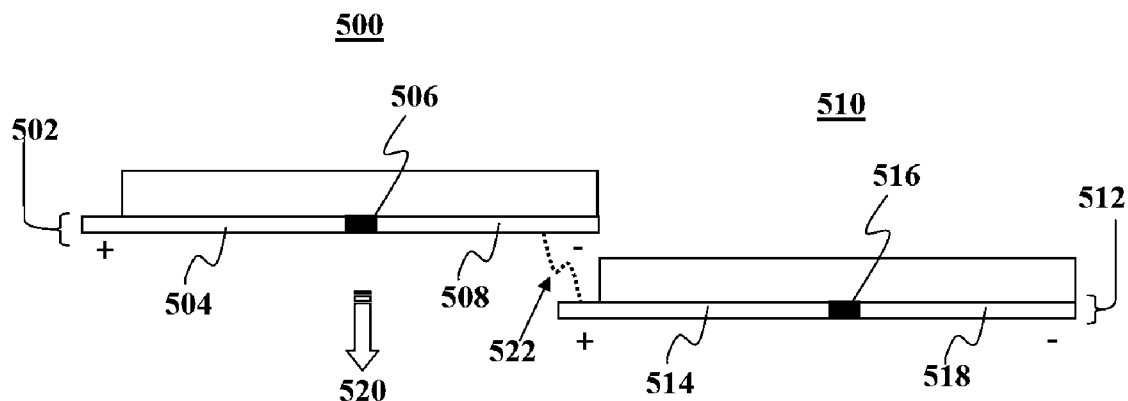
FIGS. 9 through 11 show cross-sectional views of modules which are electrically coupled by using overlapping joints according to embodiments of the present invention.

Referring now to FIG. 9, the use of metal on the backside of the module may advantageously simplify electrical connection between certain types of solar modules. FIG. 9 shows a first photovoltaic device 500 with a metal back layer 502 that has an area 504 with a positive charge, an insulator 506, and an area 508 with a negative charge. Of course, in some embodiments, the charges for area 504 and 508 may be reversed. A second photovoltaic device 510 may be provided that mates with the first photovoltaic device 500. The second photovoltaic device 510 includes a metal back layer 512 that has an area 514 with a positive charge, an insulator 516, and an area 518 with a negative charge. When the devices 500 and 510 are brought together as indicated by arrow 520, the negative lead of device 500 will contact a positive lead of device 510. Optionally, a wire or connector 522 may be used to connect the electrical leads together. In this manner, the devices 500 and 510 may be serial connected and this pattern may be repeated for a plurality of similar photovoltaic devices. This is particularly useful in shingle-type installations where one photovoltaic device is overlapped against another device. It should be understood that the photovoltaic devices 500 and 510 may be single solar cells or solar modules with a plurality of solar cells.

Figure 10:
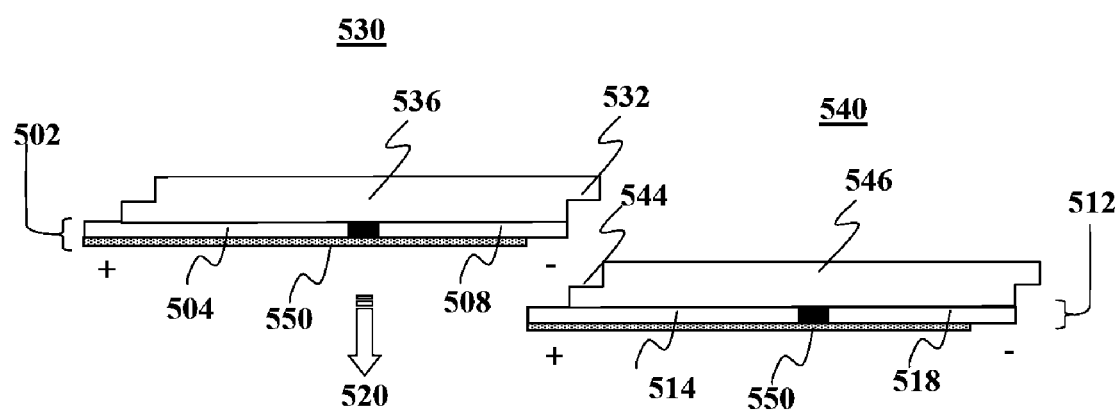

FIG. 10 shows a variation of the devices of FIG. 9 by altering the shape of the photovoltaic devices 530 and 540 at the interfaces. As seen in FIG. 10, there may be a lip 532 and a carveout 544 to create a better joint between the overlapping devices 530 and 540. This may improve the weatherproofing at such interfaces. Adhesive, epoxy, butyl tape, or other sealants may be applied at and/or around the interface to maintain a water tight seal. Optionally, a portion of the underside may also be covered with electrically insulating material 550 such as alumina or similar insulator. Preferably, the material will still allow for heat transfer to cool the photovoltaic devices.

Figure 11:
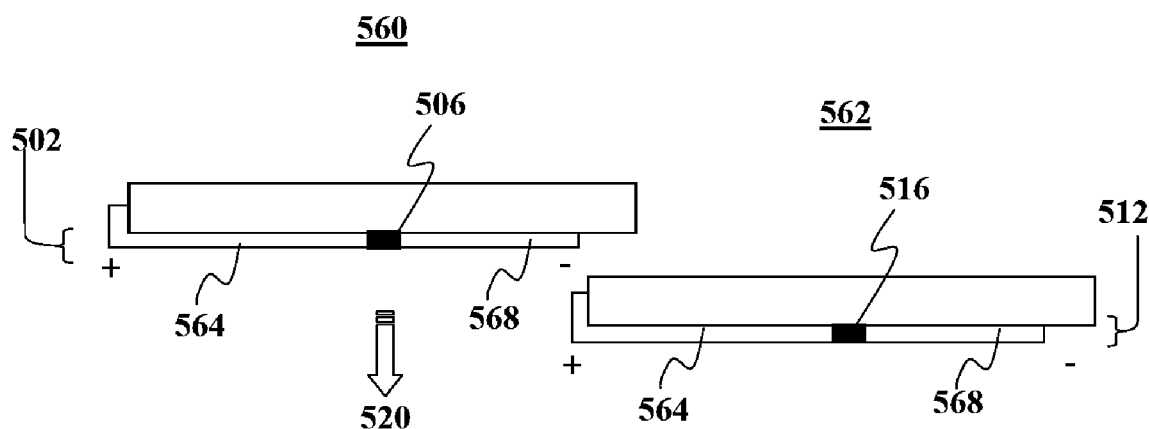

FIG. 11 shows a still further variation on the embodiment of FIG. 9 wherein the bottom surface of one module 560 contacts the bottom surface of another module 562. This again allows for an area where a water proof junction may be formed. The electrical connectors 564 and 568 on the underside of the modules may then be electrically coupled when the module 560 is lowered as indicated by arrow 520.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, the heat sink may be a plain metal foil, a three-dimensional laminar structure for air cooling, a liquid based cooling vehicle, or combinations thereof. Although metallic foil may be used for the cells and the modules and have heat transfer properties that optimize solar cell cooling, the use of silicon based solar cells is not excluded and the thermal management techniques of the present invention may be adapted for use with such solar cells. Some embodiments may optionally use a forced air device and/or an evaporation water cooling system for thermal management. Liquid cooling mediums are not limited to water, and more generally, any liquid should do including conventional cooling liquids. In fact, any convective enhancement, natural or artificial, should improve module cooling.

Furthermore, even though thin-film solar cells such as CIGS solar cells are described for the purposes of example, those of skill in the art will recognize that any of the embodiments of the present invention can be applied to almost any type of solar cell material and/or architecture. For example, the absorber layer in solar cell 10 may be an absorber layer comprised of silicon, amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, $Cu(In,Ga)(S,Se)_2$, $Cu(In,Ga,Al)(S,Se,Te)_2$, and/or combinations of the above, where the active materials are present in any of several forms including but not limited to bulk materials, micro-particles, nano-particles, or quantum dots. The CIGS cells may be formed by vacuum or nonvacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Many of these types of cells can be fabricated on flexible substrates.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. For example, U.S. patent application Ser. No. 11/465,787 filed Aug. 18, 2006 is fully incorporated herein by reference for all purposes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A photovoltaic module comprising:
   at least one photovoltaic cell formed on a metal substrate, wherein the cell includes a thermally conductive electrically insulating adhesive layer between the metal substrate and a metal back contact layer of the cell;
   a module support layer comprising a thermally conductive, electrically insulating layer and a second metal substrate, wherein the photovoltaic cell is mounted on the module support layer;
   wherein the module support layer is sized larger than the photovoltaic cell comprises of the second metal substrate coupled to a heat sink in a configuration defining a thermally conductive pathway from the metal substrate, through the thermally conductive electrically insulating adhesive layer of the cell, the metal back contact layer, and through the module support layer to allow for heat transfer from the cells to the heat sink that lowers a normal operating cell temperature (NOCT) of the photovoltaic cells;
   wherein the photovoltaic cell has a plurality of vias extending through at least an absorber layer of the photovoltaic cell, the metal substrate, and the thermally conductive electrically insulating adhesive layer, wherein the vias each have an electrically conductive portion in the via to create an electrical pathway from a transparent conductive electrode of the photovoltaic cell to the metal back contact layer.

2. The module of claim 1 wherein the metal back contact layer of the photovoltaic cell comprises a metal foil substrate in contact with the thermally conductive module support layer to define a thermal path for drawing heat away form the cell.

3. The module of claim 2 wherein the metal foil comprises of material selected from the group consisting of: stainless steel, copper, aluminum, molybdenum, or combinations thereof.

4. The module of claim 1 wherein the second metal substrate has a thermal conductivity greater than about 0.008 W/cm° C.

5. The module of claim 1 wherein the second metal substrate has a thermal conductivity greater than about 0.100 W/cm° C.

6. The module of claim 1 wherein the second metal substrate has a thermal conductivity greater than about 0.500 W/cm° C.

7. The module of claim 1 wherein the second metal substrate has a thermal conductivity greater than about 1.000 W/cm° C.

8. The module of claim 1 wherein the photovoltaic cell is a thin-film photovoltaic cell.

9. The module of claim 1 wherein the photovoltaic cell is a silicon based photovoltaic cell.

10. The module of claim 1 wherein the absorber layer comprises amorphous silicon.

11. The module of claim 1 wherein the absorber layer includes one or more inorganic materials from the group consisting of: titania ($TiO_2$), nanocrystalline $TiO_2$, zinc oxide (ZnO), copper oxide (CuO or $Cu_2O$ or $Cu_xO_y$), zirconium oxide, lanthanum oxide, niobium oxide, tin oxide, indium oxide, indium tin oxide (ITO), vanadium oxide, molybdenum oxide, tungsten oxide, strontium oxide, calcium/titanium oxide and other oxides, sodium titanate, potassium niobate, cadmium selenide (CdSe), cadmium sulfide (CdS), copper sulfide (Cu2S), cadmium telluride (CdTe), cadmium-tellurium selenide (CdTeSe), copper-indium selenide (CuInSe2), cadmium oxide (CdOx), CuI, CuSCN, a semiconductive material, or combinations of the above.

12. The module of claim 1 wherein the absorber layer includes one or more organic materials from the group consisting of: a conjugated polymer, poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof, 2,2'7,7'tetrakis(N,N-di-p-methoxyphenyl-amine)-9,9'-spirobifluorene(spiro-Me OTAD), organometallic polymers, polymers containing perylene units, poly(squaraines) and their derivatives, and discotic liquid crystals, organic pigments or dyes, a Ruthenium-based dye, a liquid iodide/triiodide electrolyte, azo-dyes having azo chromofores (—N=N—) linking aromatic groups, phthalocyanines including metal-free phthalocyanine; (HPc), perylenes, perylene derivatives, Copper pthalocyanines (CuPc), Zinc Pthalocyanines (ZnPc), naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone and pentacene, pentacene derivatives and/or pentacene precursors, an N-type ladder polymer, poly(benzimidazobenzophenanthroline ladder) (BBL), or combinations of the above.

13. The module of claim 1 wherein the absorber layer is selected from one of the following: an oligimeric material, micro-crystalline silicon, inorganic nanorods dispersed in an organic matrix, inorganic tetrapods dispersed in an organic matrix, quantum dot materials, ionic conducting polymer gels, sol-gel nanocomposites containing an ionic liquid, ionic conductors, low molecular weight organic hole conductors, C60 and/or other small molecules, or combinations of the above.

14. The module of claim 1 wherein the thermally conductive, electrically insulating layer of the module support layer comprises of an electrical insulator with a plurality of thermally conductive particles.

15. The module of claim 1 wherein the thermally conductive, electrically insulating adhesive layer of the photovoltaic cell comprises of an electrical insulator with a plurality of metal particles dispersed and spaced apart within the electrical insulator so that there is no electrical path through the layer.

16. The module of claim 1 wherein the thermally conductive, electrically insulating layer of the photovoltaic cell comprises of an insulator containing a plurality of particles selected from the group consisting of: the alumina, aluminum nitride, boron nitride, zinc oxide, beryllia, silicon, diamond, isotopically pure synthetic single crystal diamond, and/or combinations thereof.

17. The module of claim 14 wherein the thermally conductive electrically insulating adhesive layer of the cell also includes a plurality of thermally conductive particles.

18. The module of claim 1 further comprising a thermally conductive, electrically insulating pottant layer for adhering the photovoltaic cells to the module support layer.

19. The module of claim 1 wherein the second metal substrate comprises of aluminum and the thermally conductive electrically insulating layer comprises of alumina.

20. The module of claim 1 wherein the module support layer comprises of aluminum anodized to have a black alumina thermally conductive electrically insulating layer.

21. The module of claim 1 wherein module support layer has an underside that is black.

22. The module of claim 1 wherein the second metal substrate comprises of a metal foil.

23. The module of claim 1 wherein the second metal substrate comprises of at least one material selected from the group consisting of: stainless steel, copper, aluminum, molybdenum, or combinations thereof.

24. The module of claim 1 wherein the second metal substrate comprises of a substantially planar metal foil.

25. The module of claim 1 wherein the heat sink comprises a 3-dimensional laminar structure coupled to the underside of the module support layer, allowing air convection to heat away from the module.

26. The module of claim 1 wherein the heat sink comprises a water-containing vehicle coupled to the underside of the module support layer, carrying heat away from the module.

27. The module of claim 1 wherein the heat sink comprises at least one of the following: a heat sink with a plurality of metal fins, a heat sink with a corrugated cross-sectional shape, a heat sink with a honeycomb structure, a heat sink with a lattice structure defining a plurality of voids, or combinations thereof.

28. The module of claim 1 wherein a plurality of solar cells are mounted on to the module support layer, wherein the module support layer is coupled to a heat sink to cool multiple cells.

* * * * *